United States Patent
Karlin et al.

(10) Patent No.: US 8,525,316 B2
(45) Date of Patent: Sep. 3, 2013

(54) EUTECTIC FLOW CONTAINMENT IN A SEMICONDUCTOR FABRICATION PROCESS

(75) Inventors: Lisa H. Karlin, Chandler, AZ (US); Hemant D. Desai, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/914,859

(22) Filed: Oct. 28, 2010

(65) Prior Publication Data

US 2011/0042761 A1    Feb. 24, 2011

Related U.S. Application Data

(62) Division of application No. 12/414,324, filed on Mar. 30, 2009, now Pat. No. 7,846,815.

(51) Int. Cl.
*H01L 23/488* (2006.01)

(52) U.S. Cl.
USPC .......................................... 257/684; 257/734

(58) Field of Classification Search
USPC ......... 438/455–456, 106–107, 119; 257/734, 257/678, 684, E23.001
See application file for complete search history.

(56) References Cited

U.S. PATENT DOCUMENTS

| | | | |
|---|---|---|---|
| 6,479,320 B1 * | 11/2002 | Gooch | 438/109 |
| 7,628,309 B1 * | 12/2009 | Eriksen et al. | 228/194 |
| 2007/0048898 A1 * | 3/2007 | Carlson et al. | 438/106 |
| 2008/0083962 A1 * | 4/2008 | Vaganov | 257/417 |
| 2008/0317995 A1 * | 12/2008 | Oldsen et al. | 428/68 |
| 2009/0283290 A1 * | 11/2009 | Shimoi et al. | 174/50.5 |

FOREIGN PATENT DOCUMENTS

EP    1921662 A1 *  5/2008

* cited by examiner

*Primary Examiner* — Hsien Ming Lee
*Assistant Examiner* — Michele Fan
(74) *Attorney, Agent, or Firm* — Jackson Walker L.L.P.

(57) ABSTRACT

A disclosed semiconductor fabrication process includes forming a first bonding structure on a first surface of a cap wafer, forming a second bonding structure on a first surface of a device wafer, and forming a device structure on the device wafer. One or more eutectic flow containment structures are formed on the cap wafer, the device wafer, or both. The flow containment structures may include flow containment microcavities (FCMCs) and flow containment micro-levee (FC-MLs). The FCMLs may be elongated ridges overlying the first surface of the device wafer and extending substantially parallel to the bonding structure. The FCMLs may include interior FCMLs lying within a perimeter of the bonding structure, exterior FCMLs lying outside of the bonding structure perimeter, or both. When the two wafers are bonded, the FCMLs and FCMCs confine flow of the eutectic material to the region of the bonding structure.

16 Claims, 3 Drawing Sheets

EUTECTIC FLOW CONTAINMENT IN A SEMICONDUCTOR FABRICATION PROCESS

BACKGROUND

1. Field

The disclosed subject matter pertains to semiconductor fabrication and, more particularly, wafer level bonding processes.

2. Related Art

In the field of semiconductor devices, packaging considerations may be driven, at least in part, by the type of device being packaged. Micro-electrical-mechanical systems (MEMS), for example, include devices, fabricated using known semiconductor process techniques, employing structures that implement some type of mechanical function.

Wafer level bonding is generally employed to achieve a first level package for MEMS devices. Wafer level bonding refers to a process in which two wafers, at least one of which includes a semiconductor device, are bonded together. An example of a conventional wafer level bonding process is glass frit bonding. Glass frit bonding includes screen printing a frit material onto a substrate of one of the wafers prior to alignment and thermal bonding. The glass frit tends to shrink during bonding, resulting in non-uniform bondline dimensions. In addition, the deposited frit material consumes an amount of wafer real estate that prohibits or competes with device scaling desirable for achieving lower manufacturing costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
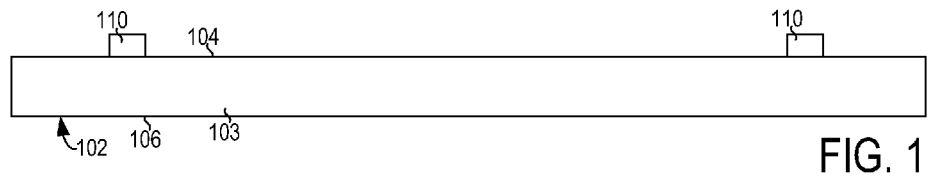
FIG. 1 is a cross sectional view of a portion of a cap wafer (inverted) after a bonding structure has been deposited on the wafer.

In one aspect, a disclosed embodiment of a semiconductor fabrication process includes forming a first bonding structure and a device cavity on a first surface of a cap wafer. A second bonding structure is formed on a first surface of a device wafer. A device structure is fabricated on the device wafer. The device structure may include a sensor or other type of MEMS device.

Eutectic flow containment structures are formed on the cap wafer, the device wafer, or both. The flow containment structures may include one or more flow containment micro-cavities (FCMCs), one or more flow containment micro-levees (FCMLs), or both.

The FCMCs may be implemented as elongated channels etched or otherwise formed in the first surface of the cap wafer. The FCMCs may extend substantially parallel to the first bonding structure in close proximity to the first bonding structure. The FCMLs may be implemented as elongated ridges or barrier walls deposited or otherwise formed overlying the first surface of the device wafer.

The FCMLs may include a first portion overlying the substrate and, optionally, a second portion overlying the first portion. The first portion may be a silicon portion, e.g., polysilicon, while the second portion may be a metal, e.g., aluminum or copper. The FCMLs may extend substantially parallel to the second bonding structure.

The bonding structures and flow containment structures may encircle the device structure. The flow containment structures may include exterior flow containment structures that encircle the bonding structure, interior flow containment structures that are encircled by the flow containment structures, or both.

A material of the first bonding structure may include a metal or semiconductor element suitable for participating in a eutectic reaction with another element. A material of the second bonding structure may also include a metal or semiconductor suitable for a eutectic reaction. The material for the first and second bonding structures may include gold, aluminum, copper, lead, silicon, germanium another suitable element, or a compound or alloy thereof.

The first and second bonding structures are brought into pressured contact while maintaining at least one of the wafers at a minimum specified temperature for a specified duration to create a eutectic bond from the first and second bonding structures. The applicable wafer(s) may be heated to a temperature approximately equal to or slightly higher than the eutectic temperature of the eutectic to be formed.

In another aspect, a disclosed embodiment of a micro-electrical mechanical device includes a device substrate, a device structure overlying a first surface of the device substrate, and a cap substrate. The cap substrate defines a device cavity that houses the device structure. A eutectic bond bonds the device substrate to the cap substrate. The eutectic bond forms a perimeter wall that circumvents the device structure. The device may include an FCML formed on the device substrate. The FCML may be implemented as an elongated ridge, in contact with or overlying a first surface of the device substrate. The FCML may extend substantially parallel to the eutectic bond. The FCML may have a height that is in the range of approximately 10% to approximately 70% of the height of the bond structure. A lateral displacement between the bond structure and the FCML may be in the range of approximately 10 to approximately 50 µm. A width of the FCML may also be in the range of approximately 10 to approximately 50 µm. The FCML may be implemented as an interior FCML that is circumvented by the bond structure or as an exterior FCML that circumvents the bond structure. Some embodiments may include both types of FCMLs.

In still another aspect, a wafer level packaging assembly includes first and second substrates and a micro-electrical mechanical device, e.g., a sensor, associated with one of the substrates. A eutectic bond bonds the first and second substrates and encircles the micro-electrical mechanical device. A flow containment structure formed on the first wafer includes an FCML in proximity to and parallel with the bond structure. The FCML may be located interior to the bond structure or exterior to it. Some embodiments may include both interior and exterior FCMLs. When the eutectic bond is formed, the FCML(s) and or FCMC(s) confine any material flowing out of the bonding structures to regions proximately to the bonding structure and away from active device areas.

Turning now to the drawings, FIG. 1 through FIG. 8 depict selected stages of an embodiment of a wafer-level bonding process. The depicted bonding process is exemplary of a eutectic bonding process suitable for use in fabrication of semiconductor devices that require a cap wafer or an analogous structural element to provide physical/mechanical protection to a MEMS structure. The depicted embodiment of the cap wafer also provides a cavity for housing the MEMS structure and for hermetic protection against moisture.

Figure 7:
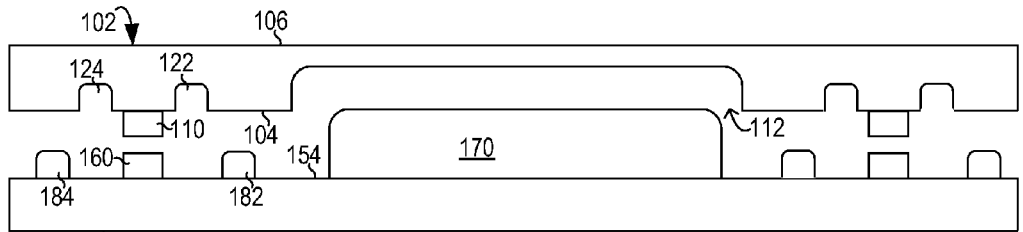
FIG. 7 depicts subsequent processing including inverting the cap wafer and aligning the cap wafer and the die wafer.
Figure 8:
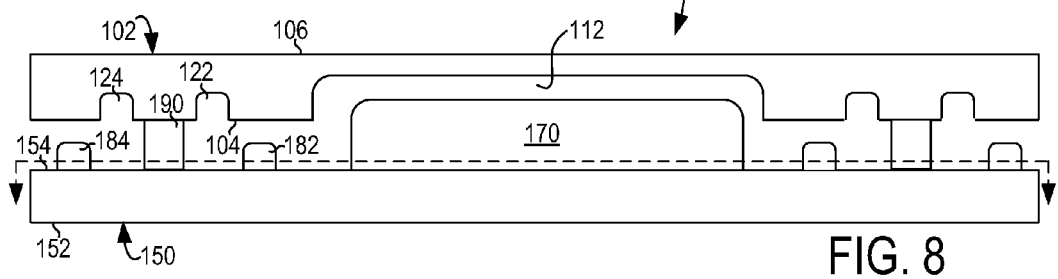
FIG. 8 depicts the bonding of the cap wafer to the die wafer.

The depicted bonding process employs two distinct wafers that are bonded together. The cap wafer 102 is depicted in isolation in FIG. 1 through FIG. 3. The device wafer 150 is depicted in isolation in FIG. 4 through FIG. 6. Respective interior surfaces of cap wafer 102 and device wafer 150 are aligned and bonded together as depicted in FIG. 7 and FIG. 8.

Referring to FIG. 1, cap wafer 102 is depicted at a selected stage in an embodiment of a cap wafer preparation process. The selected stage follows the formation of a cap wafer bonding structure 110 on an interior surface 104 of cap wafer 102. Cap wafer 102 includes a wafer bulk 103 between interior surface 104 and an exterior surface 106. Wafer bulk 103 may include semiconductor materials including crystalline, polycrystalline, or amorphous silicon, germanium, or any of a variety of compound semiconductors including gallium arsenide and various other suitable III-V compound semiconductors. In other embodiments, cap wafer bulk 103 may include or consist of a glass material or another type of dielectric.

Cap wafer 102 may be formed by micro-machining a conventional silicon wafer or other type of starting material wafer. In some embodiments, a final thickness of cap wafer 102 may be in the range of approximately 0.1 to approximately 0.8 mm. Cap wafer 102, as well as device wafer 150, may have any of various standard diameters including 200, 250, 300, or 450 mm.

At the stage depicted in FIG. 1, cap wafer bonding structure 110 has been formed on interior surface 104 of cap wafer 102. Cap wafer bonding structure 110 may be implemented as a single continuous annular element that circumvents a perimeter of the device to be fabricated. In other embodiments, cap wafer bonding structures 110 may include two or more disconnected elements.

A eutectic bonding process described below includes the alignment and thermocompression of bonding structures formed on the respective wafers. Embodiments of the eutectic bonding process may include a eutectic reaction between an element or compound in cap wafer bonding structure 110 and an element or compound in a device wafer bonding structure 150, which is depicted and described below with respect to FIG. 5. The element in cap wafer bonding structure 110 that participates in the bonding process may be a metal or semiconductor element that is capable of forming a eutectic reaction with another element. Exemplary elements suitable for use in some embodiments of a eutectic bonding process include gold, aluminum, copper, lead, silicon, and germanium. Cap wafer bonding structure 110 may, therefore, include gold, aluminum, copper, lead, silicon, and germanium or compounds or alloys containing any of these elements. Other embodiments may, however, employ different elements.

In some embodiments, the formation of cap wafer bonding structure 110 is achieved using thin film deposition, mask, and etch techniques including techniques that may be well known in the field of semiconductor fabrication processes. The deposition of a film from which cap wafer bonding structure 110 is formed may include a chemical vapor deposition process, a physical vapor deposition process, or another suitable deposition process. In some embodiments, a thickness of the layer from which cap wafer bonding structure 110 is formed is in the range of approximately 1 μm to approximately 50 μm depending on factors including the material used. Other embodiments may, however, use thinner or thicker films to form cap wafer bonding structure 110.

After the cap wafer bonding structure layer is deposited, the deposited layer may then be masked and etched using known techniques to achieve the desired bonding structure or structures. Because a minimum dimension of cap wafer bonding structures 110 may be comparatively large relative to transistors and other more conventional semiconductor structures, the lithography processes for the bonding structure layers may be performed on lower cost and higher throughput exposure tools such as contact or proximity printers.

Figure 2:
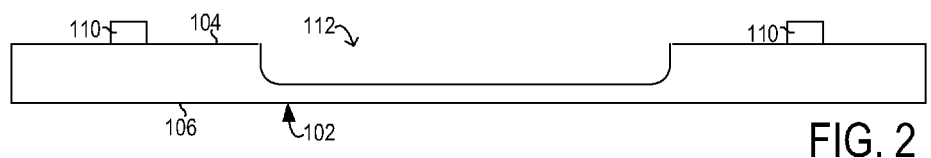
FIG. 2 depicts subsequent processing of the cap wafer including the formation of a device cavity in the cap wafer.
Figure 3:
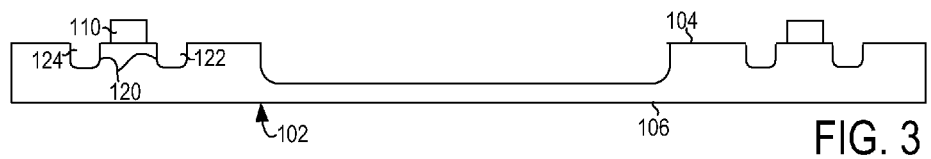
FIG. 3 depicts subsequent processing of the cap wafer including the formation of flow containment micro-cavities in the cap wafer.

Referring now to FIG. 2 and FIG. 3, the depicted stages of the cap wafer fabrication process emphasize the formation of various cavities or voids in an interior surface of cap wafer 102. As depicted in FIG. 2, a device cavity 112 has been formed in a central region of cap wafer 102. In FIG. 3, a set of FCMCs 120 have been formed in peripheral portions of cap wafer 102. Device cavity 112 and FCMCs 120 may be formed using conventional photolithography and etch processing techniques. For embodiments that employ a silicon cap wafer 102, for example, the formation of device cavity 112 and/or FCMCs 120 may include the use of conventional wet or dry silicon etch techniques. In other embodiments, device cavity 112 and FCMCs 120 are formed using different photolithography steps, different etch steps, or both. In still other embodiments, device cavity 112 may be formed with a wet etch process while FCMCs 120 are formed with a dry etch or vice versa.

In some embodiments, device cavity 112 is dimensioned and located to provide a housing space for a MEMS structure or other type of micro-machined element. A depth of device cavity 112 may be specified as a percentage of the thickness of cap wafer 102. Although different embodiments may employ device cavities of different depths, the depicted embodiment of device cavity 112 may have a depth that extends anywhere from approximately 10% to approximately 80% of the thickness of cap wafer 102.

In the depicted embodiment, the FCMCs 120 are shallower than the device cavity 112 although this may not be true in other embodiments. In some embodiments, FCMCs 120 may have a depth of approximately 0.1 μm to approximately 2 μm. Other embodiments may employ FCMCs 120 having different depths. In addition, other embodiments may employ FCMCs 120 that are non uniform in depth, with some FCMCs being deeper than others.

The FCMCs 120 may be positioned within cap wafer 102 in different layouts or configurations. These various configurations may be characterized by the location of FCMCs 120 relative to cap wafer bonding structure 110 as well as by the location of FCMCs 120 relative to other flow containment structures, referred to herein as FCMLs, that are described below with respect to FIG. 6. Cap wafer 102 may include FCMC configurations in which one or more interior FCMC (s) 122 are located interior to cap wafer bonding structure 110, one or more exterior FCMC(s) 124 are located exterior to cap wafer bonding structure 110, or both. As depicted in FIG. 3, for example, FCMCs 120 include an interior FCMC 122 and exterior FCMC 124. FCMCs 122 and 124 may be characterized by their location relative to FCML described below.

As suggested by the name, FCMCs 120 are operable to serve as containment structures for any flow of material resulting from eutectic processing. FCMCs 120 may circumvent the entire structure of a device. The lateral spacing between adjacent FCMCs 120 and the lateral spacing between an FCMC 120 and bonding structure 110 is implementation specific, but some embodiments may employ a minimum spacing in the range of approximately 100 nm to approximately 500 nm.

Figure 4:
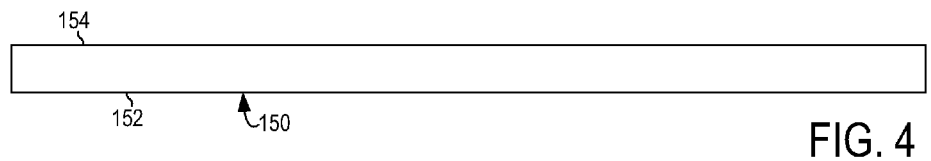
FIG. 4 is a cross section view of a portion of a die wafer.
Figure 5:
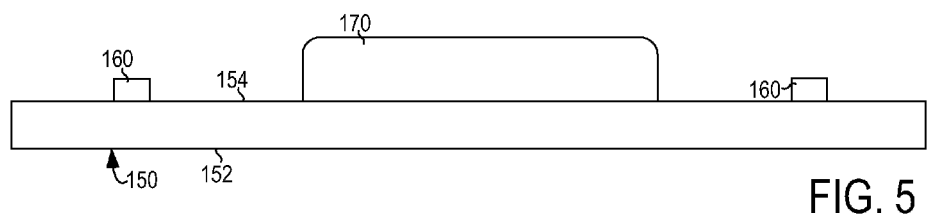
FIG. 5 depicts subsequent processing of the die wafer including the fabrication of device structures and the formation of bonding structures.
Figure 6:
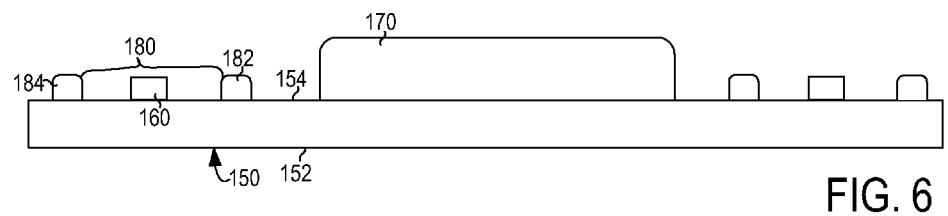
FIG. 6 depicts subsequent processing of the die wafer including the formation of flow containment micro-levees on the die wafer.

Turning now to FIG. 4 through FIG. 6, selected stages in an embodiment of a device wafer preparation process are depicted. In the depicted embodiment, FIG. 4 depicts a device wafer 150 including an exterior surface 152 and an interior surface 154. Device wafer 150 may have a thickness comparable to or greater than a thickness of cap wafer 102. Although not illustrated in FIG. 4, device wafer 150 may include various layers and structures that will be known to those in the field of semiconductor fabrication processes including, as examples, buried oxide layers, epitaxial layers, well structures, transistors, diodes, capacitors, and other active and passive elements, interconnect structures, interlevel dielectric structures, and so forth.

Device wafer 150 itself may be fabricated by micro-machining a conventional 200, 250, 300, or 450 mm silicon or silicon-on-insulator (SOI) starting material wafer down to a thickness in a desired range. In other embodiments, the starting material wafer may be used as is, without any wafer thinning.

Referring to FIG. 5, a stage in the depicted embodiment of device wafer preparation process illustrates the formation of a device structure 170 as well as a device wafer bonding structure 160. Device structure 170 may represent a sensor or other type of MEMS structure that provides mechanical or electromechanical functionality to the integrated circuit. The depiction of device structure 170 is not, however, intended to necessitate any particular sequence of fabrication processing or any particular device design or function and other embodiments may include traditional integrated circuit elements such as transistors in device structure 170.

Device wafer bonding structure 160 may be similar to the corresponding bonding structures 110 on cap wafer 102 as depicted in FIG. 2. As described previously with respect to cap wafer bonding structures 110, some embodiments of device wafer bonding structure 160 may include a metal or semiconductor element or a compound containing a metal or semiconductor element that is capable of forming a eutectic reaction with an element in cap wafer bonding structure 110. Thus, as was true for cap wafer bonding structure 110, device wafer bonding structure 160 may include gold, aluminum, copper, lead, silicon, germanium, other suitable materials, or compounds or alloys thereof.

Device wafer bonding structure 160 may be formed using conventional deposition, photolithography, and etch processing. Like cap wafer bonding structure 110, device wafer bonding structure 160 may include a single continuous element that traverses a perimeter of a region occupied by device structure 170. Alternatively, device wafer bonding structure 160 may be fabricated as two or more distinct physical elements. A thickness of the layer from which device wafer bonding structure 160 is formed may be in the range of approximately 1 µm to approximately 50 µm depending upon factors including the type of material used for bonding structure 160.

Device wafer 150 may include certain circuit interconnect elements including "through vias" and the like that are not depicted explicitly. In these embodiments, these interconnect elements may facilitate interconnection between internal components of device wafer 150 and external elements.

Turning now to FIG. 6, device wafer 150 is depicted following the formation of FCMLs 180. FCMLs 180 may include a traditional semiconductor material such as silicon, a dielectric, or a metal such as aluminum, copper, or another conductive material. In embodiments of a fabrication process that includes the use of a second layer of polysilicon, commonly referred to as "poly 2", for example, FCMLs 180 may be fabricated during the poly 2 deposition and etch processing so that the FCMLs 180 do not require the inclusion of substantial additional processing steps. In still other embodiments, FCML 180 may include multiple layers of different materials. FCML 180 may, for example, include a metal portion such as aluminum overlying a semiconductor portion such as polysilicon.

In some embodiments, the height of FCMLs 180 is controlled to ensure that the FCMLs do not interfere with a contact between bonding structures 110 and 160 when cap wafer 102 and device wafer 150 are bonded.

Like FCMCs 120 described above with respect to FIG. 3, FCMLs 180 may be implemented according to various configurations or layouts. The FCMLs 180 may, for example, include interior FCMLs 182 that are interior to bonding structure 160 and exterior FCMLs 184 that are exterior to bonding structure 160. In addition, FCMLs 180 may be located based, at least in part, on their position relative to FCMCs 120 in cap wafer 102. Specific examples of possible configurations of flow containment elements are illustrated below with respect to FIG. 10 through FIG. 16.

Referring now to FIG. 7 and FIG. 8, the alignment and bonding together of cap wafer 102 and device wafer 150 are depicted. In FIG. 7, cap wafer 102 is flipped 180 degrees relative to the orientation depicted in FIG. 1 through FIG. 3. In the orientation depicted in FIG. 7, interior surface 104 of cap wafer 102 and interior surface 154 of device wafer 150 oppose one another. Cap wafer bonding structure 110 is aligned to device wafer bonding structure 160 as depicted in FIG. 7. In this aligned state, device structure 170 on device wafer 150 is aligned to device cavity 112 of cap wafer 102. Aligning cap wafer 102 to device wafer 150 can be achieved using various wafer alignment techniques known to those of ordinary skill the field of semiconductor fabrication and packaging.

FIG. 8 depicts a thermcompressive bonding process in which cap wafer bonding structure 110 and device wafer bonding structure 160 form a eutectic bond 190 with device cavity 112 housing device structure 170. The eutectic bonding may include heating one or both of the bonding structures to a temperature just above the eutectic temperature for the applicable eutectic reaction. Desirably, the eutectic temperature may be substantially lower than the melting point of any of the elements or compounds in the bonding structures. A lower melting point is desirable to reduce the thermal exposure to which the wafers are subjected.

The process parameters of the thermocompressive bonding depicted in FIG. 8 are dependent upon the materials used for bonding structures 110 and 160 and other factors. An exemplary process for forming Au—Si eutectic bonds might, in one embodiment, include heating cap wafer 102, device wafer 150, or both to a temperature in the range of approximately 350 C to approximately 450 C, and placing the wafers in contact with each under a bonding force of approximately 5000 to approximately 9000 mBar for a duration of approximately 5 to approximately 40 minutes.

In embodiments that employ a MEMS device structure 170, the wafer level assembly 100 that results from the bonding process represents a MEMS assembly. In addition to bonding cap wafer 102 and device wafer 150, eutectic bond 190 provides a hermetical seal that inhibits penetration of moisture and other contaminants from entering device cavity 112 and potentially adversely altering device structure 170.

Figure 9:
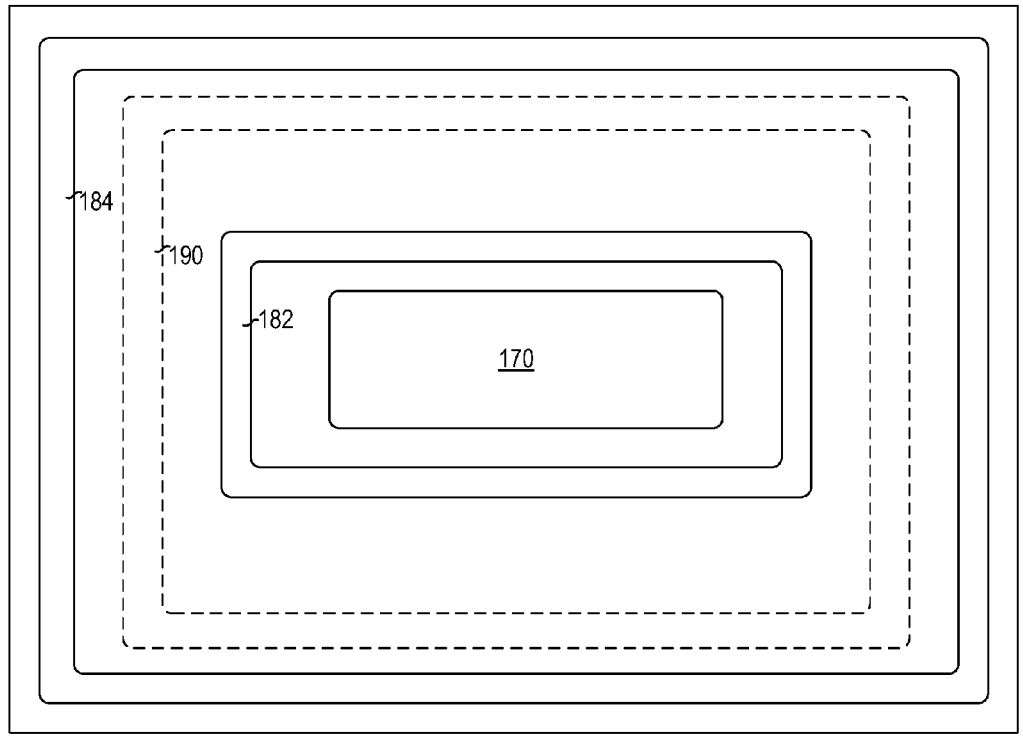
FIG. 9 is a top view of the die wafer of FIG. 7 and FIG. 8 depicting flow containment micro-levees circumventing the device interior and exterior to the bonding structure.

FIG. 9 depicts a cross section view of a MEMS device 100 wafer 150 illustrating an embodiment in which the interior FCML 182, eutectic bond 190, and exterior FCML 184 all form continuous annular or ring structures that circumvent device structure 170. It will be appreciated that FIG. 9 is not to scale and that the device structure 170 would generally encompass proportionally more substrate real estate than the flow containment and bonding structures.

Referring now to FIG. 10 through FIG. 16, various configurations of internal and external FCMCs and FCMLs are depicted. In these depictions, it should be noted that the orientation of cap wafer 102 is "flipped" with respect to the orientation of cap wafer 102 as shown in FIG. 1 through FIG. 3.

Figure 10:
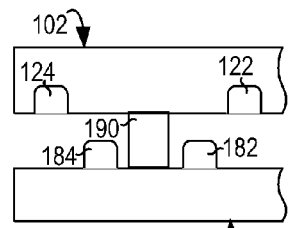
FIG. 10 through FIG. 16 depict various embodiments of configurations of flow containment micro-cavities and flow containment micro-levees.
Figure 11:
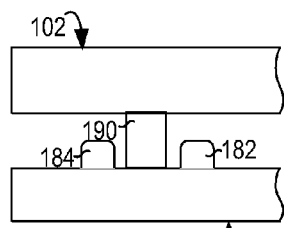
Figure 12:
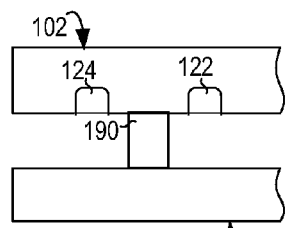
Figure 13:
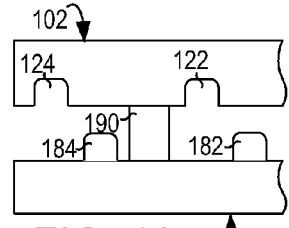
Figure 14:
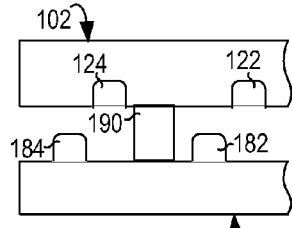
Figure 15:
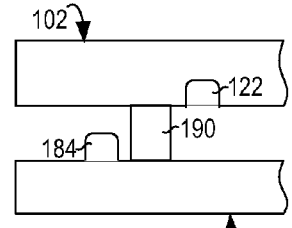
Figure 16:
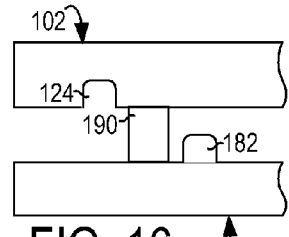

The implementation depicted in FIG. 10, for example, includes an interior FCMC 122 and an exterior FCMC 124 on cap wafer 102 as well as interior and exterior FCMLs 182, 184 on device wafer 150. FCMLs 182, 184 are positioned in closer lateral proximity to bonding structures 110, 160 than FCMCs 122, 124. FIG. 11 depicts an implementation that includes interior and exterior FCMLs 182, 184 on device wafer 150, but no FCMCs. FIG. 12 depicts an implementation that includes interior and exterior FCMCs 122, 124 in cap wafer 102, but no FCMLs. FIG. 13 depicts a "staggered" implementation that includes interior and exterior FCMCs 122, 124 in cap wafer 102 and interior and exterior FCMLs 182, 184 on device wafer 150. In this embodiment, exterior FCML 184 and interior FCMC 122 are located in proximity to eutectic bond 190 while interior FCML 182 and exterior FCMC 124 are distal from eutectic bond 190. FIG. 14 depicts another staggered configuration, but with interior FCML 182 and exterior FCMC 124 positioned proximal to eutectic bond 190 and exterior FCML 184 and interior FCMC 122 distal from eutectic bond 190. FIG. 15 depicts an implementation that includes an interior FCMC 122 and an exterior FCML 184, but no exterior FCMC or interior FCML. FIG. 16 depicts an embodiment that includes an exterior FCMC 124 and an interior FCML 182, but no interior FCMC or exterior FCML.

Although the invention described herein with reference to specific embodiments, various modifications and changes can be made without departing from the scope of the present invention as set forth in the claims below. For example, although the illustrated embodiments employ FCMCs on the cap wafer and FCMLs on the device wafer, other embodiments may employ FCMCs on the device wafer and/or FCMLs on the cap wafer. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A micro-electro-mechanical device, comprising:
   a device substrate including a device structure;
   a cap substrate defining a device cavity overlying the device structure;
   a bonding structure connecting the device substrate and the cap substrate, wherein the bonding structure circumvents the device structure;
   a flow containment micro-levee (FCML) formed on a first substrate, wherein the first substrate is selected from the device substrate and the cap substrate, wherein the FCML comprises an elongated ridge overlying a first surface of the first substrate, the FCML extending substantially parallel to the bonding structure; and
   a flow containment micro-cavity (FCMC) formed in a second substrate, wherein the second substrate is selected from the device substrate and the cap substrate, wherein the FCMC comprises an elongated channel formed in a first surface of the second substrate, the FCMC extending substantially parallel to the bonding structure;
   wherein the FCML circumvents the bonding structure.

2. The device of claim 1, wherein the FCML is circumvented by the bonding structure.

3. The device of claim 1, wherein the FCML comprises a first FCML of a plurality of FCMLs.

4. The device of claim 1, wherein the FCMC comprises a first FCMC of a plurality of FCMCs.

5. The device of claim 4, wherein the plurality of FCMCs includes the first FCMC and a second FCMC, wherein the bonding structure circumvents the first FCMC and wherein the second FCMC circumvents the bonding structure.

6. The device of claim 1, wherein the FCMC comprises a first FCMC of a plurality of FCMCs and wherein the FCML comprises a first FCML of a plurality of FCMLs.

7. The device of claim 6, wherein the bonding structure circumvents the first FCML and the first FCMC and wherein a second FCML and a second FCMC circumvents the bonding structure.

8. The device of claim 7, wherein a lateral displacement between the first FCML and the bonding structure is less than a lateral displacement between the first FCMC and the bonding structure.

9. The device of claim 8, wherein a lateral displacement between the second FCML and the bonding structure is less than a lateral displacement between the second FCMC and the bonding structure.

10. The device of claim 8, wherein a lateral displacement between the second FCML and the bonding structure is greater than a lateral displacement between the second FCMC and the bonding structure.

11. The device of claim 1, wherein the first substrate and the second substrate are the same substrate.

12. The device of claim 11, wherein the first substrate and the second substrate are the cap substrate.

13. The device of claim 1, wherein the first substrate and the second substrate are different substrates.

14. The device of claim 13, wherein the first substrate is the device substrate and the second substrate is the cap substrate.

15. A micro-electro-mechanical device, comprising:
   a device substrate including a device structure;
   a cap substrate defining a device cavity overlying the device structure;
   a bonding structure connecting the device substrate and the cap substrate, wherein the bonding structure circumvents the device structure;

a flow containment micro-levee (FCML) formed on a first substrate, wherein the first substrate is selected from the device substrate and the cap substrate, wherein the FCML comprises an elongated ridge overlying a first surface of the first substrate, the FCML extending substantially parallel to the bonding structure; and a flow containment micro-cavity (FCMC) formed in a second substrate, wherein the second substrate is selected from the device substrate and the cap substrate, wherein the FCMC comprises an elongated channel formed in a first surface of the second substrate, the FCMC extending substantially parallel to the bonding structure;

wherein the FCML has a height and the FCMC has a depth in a range of approximately 10% to approximately 70% of a height of the bonding structure, a lateral displacement between the bonding structure and the FCML is in a range of approximately 10 um to approximately 50 um, and a width of the FCML and the FCMC is in a range of approximately 10 um to approximately 50 um.

16. A micro-electro-mechanical device, comprising:

a device substrate including a device structure;

a cap substrate defining a device cavity overlying the device structure;

a bonding structure connecting the device substrate and the cap substrate, wherein the bonding structure circumvents the device structure;

a flow containment micro-levee (FCML) formed on a first substrate, wherein the first substrate is selected from the device substrate and the cap substrate, wherein the FCML comprises an elongated ridge overlying a first surface of the first substrate, the FCML extending substantially parallel to the bonding structure; and a flow containment micro-cavity (FCMC) formed in a second substrate, wherein the second substrate is selected from the device substrate and the cap substrate, wherein the FCMC comprises an elongated channel formed in a first surface of the second substrate, the FCMC extending substantially parallel to the bonding structure;

wherein the FCML comprises a first FCML of a plurality of FCMLs and wherein the plurality of FCMLs includes the first FCML and a second FCML, wherein the bonding structure circumvents the first FCML and wherein the second FCML circumvents the bonding structure.

* * * * *